United States Patent [19]
Gregerson

[11] Patent Number: 5,967,571
[45] Date of Patent: Oct. 19, 1999

[54] VACUUM ACTUATED MECHANICAL LATCH

[75] Inventor: Barry Gregerson, Deephaven, Minn.

[73] Assignee: Empak, Inc., Chanhassen, Minn.

[21] Appl. No.: 08/913,228

[22] PCT Filed: Oct. 13, 1995

[86] PCT No.: PCT/US95/12513

§ 371 Date: Sep. 9, 1997

§ 102(e) Date: Sep. 9, 1997

[87] PCT Pub. No.: WO97/13947

PCT Pub. Date: Apr. 17, 1997

[51] Int. Cl.[6] .................................................... E05C 1/06
[52] U.S. Cl. ........................... 292/33; 292/164; 292/138
[58] Field of Search ........................... 292/144, 33, 164; 141/85, 98, 383, 384, 385, 386; 414/217, 221, 292

[56] References Cited

U.S. PATENT DOCUMENTS

| | | | |
|---|---|---|---|
| 2,344,826 | 3/1944 | Gresley | 292/33 |
| 2,530,628 | 11/1950 | Pivero | 292/33 |
| 2,888,287 | 5/1959 | Taylor | 292/33 |
| 3,004,756 | 10/1961 | Williams | 292/33 |
| 3,638,983 | 2/1972 | Flournoy et al. | 292/33 |
| 4,575,136 | 3/1986 | Keller | 292/33 |
| 4,609,215 | 9/1986 | Self et al. | 292/33 X |
| 4,674,936 | 6/1987 | Bonora et al. | 414/217 |
| 4,674,939 | 6/1987 | Maney et al. | 414/292 |
| 4,724,874 | 2/1988 | Parikh et al. | 141/98 |
| 4,739,882 | 4/1988 | Parikh et al. | 206/454 |
| 4,995,430 | 2/1991 | Bonora et al. | 141/98 |
| 5,271,516 | 12/1993 | Cook et al. | 220/232 |
| 5,291,923 | 3/1994 | Gallagher et al. | 141/98 |
| 5,370,491 | 12/1994 | Bonora et al. | 414/217 |

*Primary Examiner*—Steven Meyers
*Assistant Examiner*—Teri Pham
*Attorney, Agent, or Firm*—Nikolai, Mersereau & Dietz, P.A.

[57] ABSTRACT

A vacuum actuated mechanical latch is attachable to a hermetically sealable container. The latch is attached, formed, or otherwise integral with the door of the container. The latch is easily engaged and disengaged by processing equipment. Also, the latch is designed to minimize the amount of abraded particulate and further isolate any particulate generated. Further, when the door is latched to the container, the latch is not easily overcome by jarring or bumping. The lead-in surface of the latch is angled to minimize friction when the latch is forced into a first locking position.

13 Claims, 5 Drawing Sheets

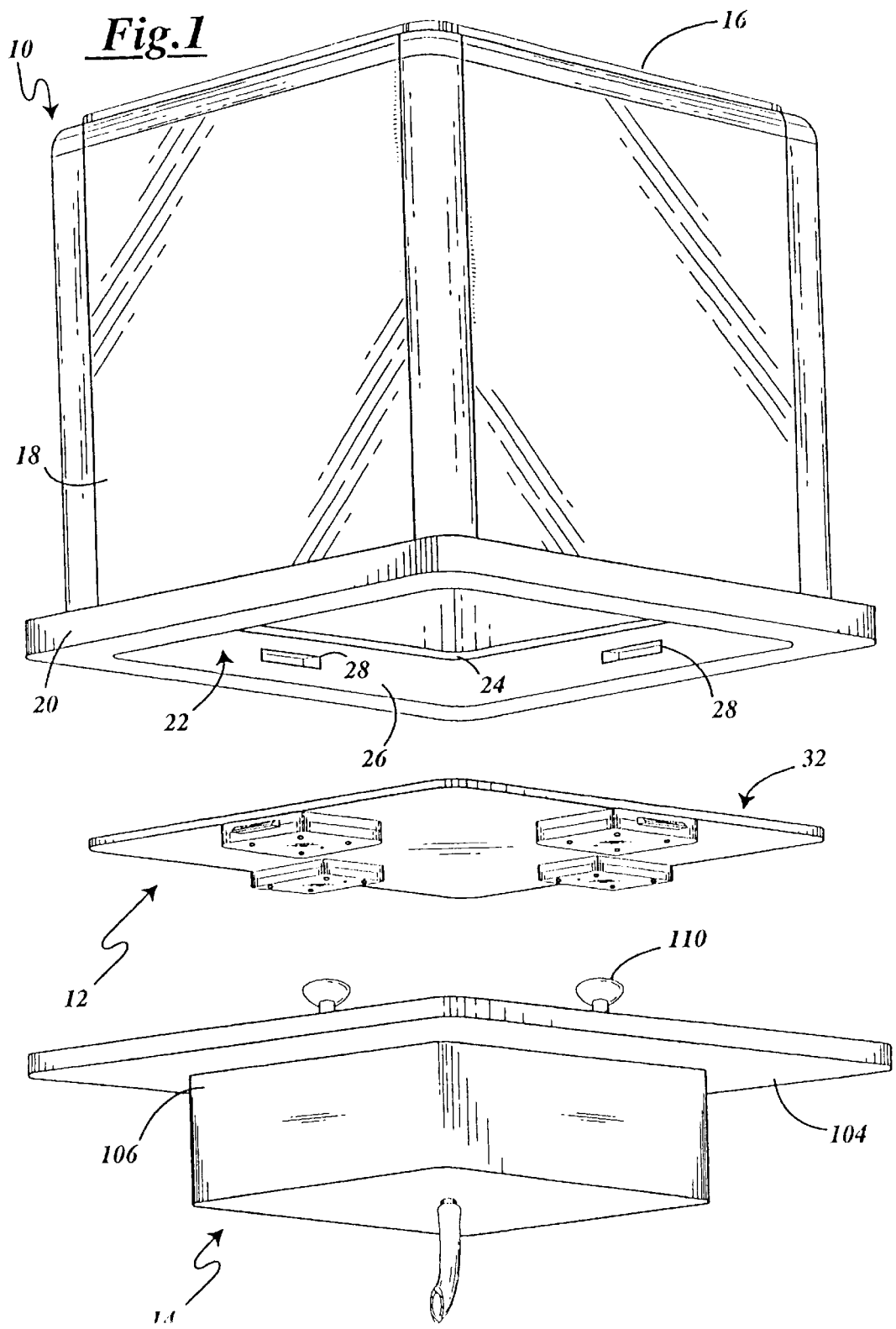

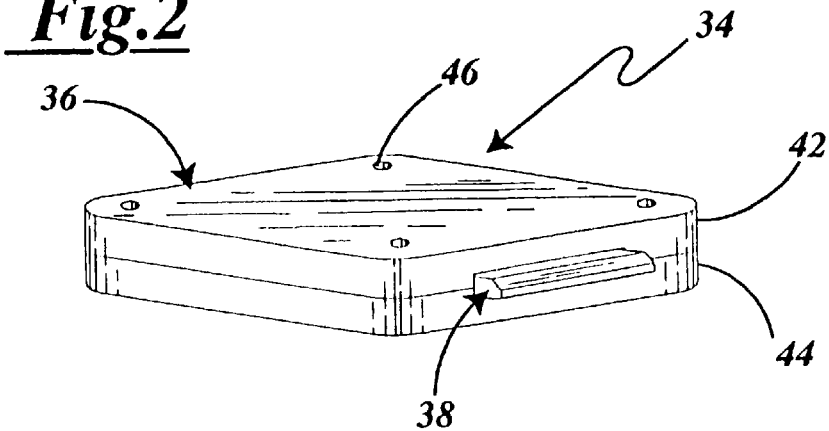
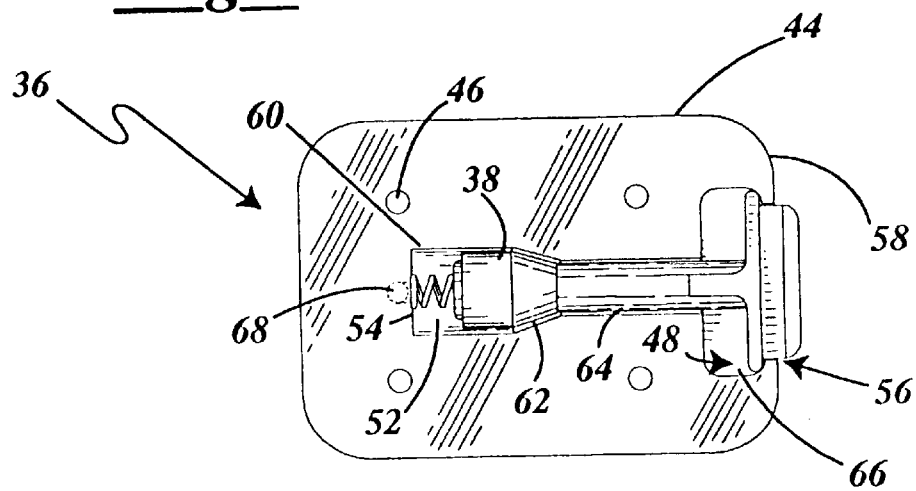
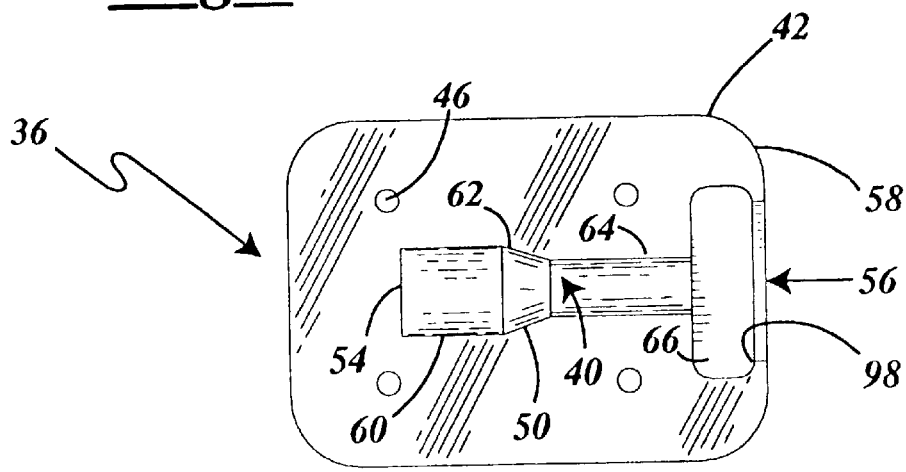

VACUUM ACTUATED MECHANICAL LATCH

BACKGROUND OF THE INVENTION

I. Field of the Invention

This invention relates generally to a mechanical latch for securing a door or lid to a container. More specifically, this invention relates to a vacuum actuated mechanical latch, which latches the door to the container, retaining the door in a hermetically sealed position. Jarring or bumping the container will not disengage or release the latch from the container.

II. Discussion of the Related Art

The sensitivity to contamination of materials used to produce semiconductors is a significant problem faced by semiconductor manufacturers. Standardized Mechanical Interface (SMIF) systems have been designed to reduce contamination from airborne particles and vapors during the processing, transportation or storage of these sensitive materials. A SMIF system includes a hermetically sealable container used to transport a semiconductor substrate made from the sensitive materials. A SMIF cassette is typically used to confine the semiconductor substrate within the SMIF container. The semiconductor substrate may include a wafer, LCD, flat panel display, and or memory disks. For discussion purposes, and without limitation, reference will be made to semiconductor wafers.

During the processing, transportation and storage of semiconductor wafers, it is critical that the semiconductor wafers be isolated from damaging particulate. The size of the particulate that is damaging to the semiconductor wafer is determined by the geometry of the semiconductor. As the geometry of the semiconductor decreases, the size of the particulate to be eliminated likewise decreases. The presence of vapors or static discharge in the environment also impairs the production of semiconductors, including the wafers themselves. Hence, use of materials having low outgassing characteristics is desired.

It has been found that slight abrasions to the SMIF system containing semiconductor wafers can generate damaging particulate. Static electricity may attract the abraded damaging particulate to the inside surfaces of the SMIF container or to the semiconductor wafers themselves. When particulate has attracted to the inner surface of the SMIF container, moving the container may cause particulate to become airborne, landing on the semiconductor wafers and later damaging the semiconductor wafers. Circulating and filtering air or other gas within the SMIF container does not readily remove the particulate from the inner surfaces of the SMIF container. Although the SMIF container may be cleaned, it is difficult to clean the container entirely of particulate attracted to the inner surface of the container.

The maintenance of an adequately clean environment during the transportation, processing and storage of semiconductor wafers is crucial. Automated processing equipment has been developed to minimize contact and exposure of the semiconductor wafers to damaging particulate. Likewise, containers or isolation structures have developed which protect the wafers and can be manipulated robotically by the processing equipment. Typically, the isolation structure or SMIF container is hermetically sealed from the external environment by a door or lid and is opened only when engaged in a clean mini-environment by the port door of a processing tool. In this way, risk of contamination is substantially reduced. Thus, it is important that the door of the SMIF container remain hermetically sealed, unless disengaged by the processing equipment in a clean environment.

Once a hermetic seal is formed, the door must remain secured to the container. Various latching arrangements have been developed to secure the door to the container, while minimizing the amount of mechanical movement and particulate generation. One such device is disclosed by Gallagher et al., in U.S. Pat. No. 5,291,923 (the '923 patent). This patent discloses a flexible, collapsible, membrane or bladder type seal. A vacuum is applied through a manifold to the interior of a closure member used to seal a SMIF container. When the vacuum is applied, the seal collapses thereby allowing the door to be removed. When the vacuum is released, the seal slowly expands to its original shape. To decrease the amount of time it takes for the seal to expand to its original shape and seal the door to the container, a positive pressure may be applied.

The arrangement disclosed by Gallagher et al. has proven to be effective in various circumstances. However, severe bumping or jarring can cause the door to disengage from the container, contaminating the semiconductor wafers stored within the container. Such bumping and jarring occurs all too often in the typical manufacturing facility. Also, the vacuum arrangement increases the necessary time for the processing equipment to release or engage the door to the container. Hence, a need exists for a latching member that may be engaged or disengaged quickly, that is not as easily disengaged by jarring or bumping.

Various mechanical latches, such as that disclosed by Parikh et al. in U.S. Pat. No. 4,724,874 have been used with some success. However, efforts to design such latches to eliminate the generation of particulate when the latch is engaged and disengaged have been unsuccessful. As mentioned above, any amount of particulate generated may be damaging to the semiconductor wafers.

Hence, a need exists for a latch which, among other things: (1) may be engaged and disengaged efficiently by processing equipment; (2) is not easily overcome by bumping or jarring the container; (3) minimizes generation of contaminating particulate during actuation of the latch; and (4) isolates and removes particles abraded from the latch so such particles do not contaminate the contents of the container. The present invention provides such a latch.

SUMMARY OF THE INVENTION

The present invention provides a vacuum actuated mechanical latch that may be used to secure a door to the opening of a container. The latch is designed to minimize generation of particulate as it is actuated. The latch is also designed to isolate and remove particulate generated by the latch, so that such particulate does not contaminate the interior of the container or surrounding environment. The vacuum actuated mechanical latch is adapted to be used on any hermetically sealed container, however, for illustrative purposes reference will be made to a SMIF container. Those skilled in the art will recognize that the vacuum actuated mechanical latch may be adapted for use on other type or sized containers.

In the preferred embodiment, the vacuum actuated mechanical latch comprises a housing, a plunger, and a compression spring. The housing has a mortise provided therein, whereby the plunger is slidable within the mortise between a first locking position and a second retracted position. The mortise extends from an outer surface of the housing, defining an opening into the housing. The mortise terminates within the housing, forming a closed end of the mortise. When the plunger is in the first locking position, a portion of the plunger extends out of the housing through the opening of the housing. The compression spring serves to bias the plunger through the mortise, toward the first locking position. A duct extends into the mortise through which a vacuum can be applied to overcome the force of the spring, thereby actuating the plunger from the first locking position to the second retracted position.

The latch is attached to the outer bottom surface of the door which is hermetically sealed to a container. The container has four enclosed sides, an enclosed top, and an open bottom. The open bottom is surrounded by a lip. Recesses are formed on an inner surface of the lip of the container. When the plunger is in the first locking position, each recess mates with the plunger of a corresponding latch, thereby securing the door to the container. Of course, the latch may instead be formed integral within the container, latching to a recess formed within the door. In a preferred embodiment, separate latches engage each interior side of the container. Those skilled in the art will recognize that when the container or pod is cylindrical in shape, for example, three latches equilaterally spaced will suffice to hold the door sealed against the container.

When the door is secured to container, a vacuum is applied to the latch to retract the latch from the recess. As the latch is retracted by the vacuum, any particles within the latch are drawn out of the latch by the vacuum so that the particles cannot contaminate the inside of the container or the external environment. When the vacuum is decreased so that the spring biases the plunger toward the locking position, a slight vacuum may be applied to create a back pressure which removes particulate generated as the plunger slides through the mortise.

The vacuum is applied through the duct which extends into the mortise proximate the closed end of the mortise. A vacuum is applied through the duct strong enough to counteract the force of the compression spring, thereby drawing the plunger and head into the mortise. When the plunger head is protruding from the housing, the plunger is in the first locking position, and when the plunger head is retracted into the mortise, the plunger is in the second retracted position. The force applied by the compression spring should be sufficient to keep the plunger in the locked position even when the container is bumped or jarred.

In the preferred embodiment, the plunger and mortise have distinct compatible shapes. The plunger consists of a barrel having a head formed on one end of the barrel and a seat formed on the other end of the barrel. The compression spring is positioned between the seat of the plunger and the closed end of the mortise. The barrel has a shoulder extending longitudinally from the end distal to the head, which tapers from a larger first diameter to a smaller second diameter. This taper serves as a stop which prevents the plunger from sliding completely out of the housing.

The plunger may have a recess extending into the plunger along the longitudinal axis of the barrel portion. A portion of the compression spring may be positioned within this recess. Additionally, an annular channel may be formed within the planar surface of the seat. A gasket or o-ring is positioned within the channel formed in the seat. When the plunger is drawn by the vacuum to the second open position, the o-ring sealably engages the closed end of the mortise.

When the plunger is sealed against the closed end of the mortise, the pressure of the vacuum changes. This change in pressure may be used as an indicator for the processing equipment that the latch is retracted to the second open position. Before the plunger seals against the closed end of the mortise, any particulate generated by the latch is suctioned by the vacuum, further isolating the semiconductor wafers from any damaging particulate.

In an alternate preferred embodiment, the latches are formed within the door itself. The door serves as the housing for all four latches. A mortise is provided on each side of the door, whereby the plunger is slidable within the mortise between a first locking position and a second retracted position. A duct extends from the bottom surface of the door into each mortise. In this manner, a port door of the processing tool may seal to the outer perimeter of the door, creating a manifold which links all the ducts of the several latches to a central vacuum line.

In another alternate preferred embodiment, the latch includes a flexible elastomeric seal attached to the head of the plunger. The seal creates a vacuum chamber within a cavity of the mortise and further isolates the plunger and spring from the external environment.

Without limitation at least three important advantages are provided by such vacuum actuated mechanical latches. First, the door and container are firmly held together. Second, when the latch is actuated, a cushion of air exists between the mortise and plunger to float the plunger within the mortise, thereby reducing scrapping between the mortise and plunger as the plunger slides within the mortise. Third, the vacuum serves to draw out of the latch any particles that may be generated. Thus, the design provides several unique advantages.

It is accordingly a principal object of the present invention to provide a vacuum actuated mechanical latch for securing a door to a container.

Another object of the present invention is to provide a latch for a SMIF container that is not overcome by jarring or bumping forces.

Still another object of the present invention is to provide a mechanical latch that minimizes and isolates the amount of particulate generated by the latch.

Yet another object of the present invention is to provide a latch that is easily engaged and disengaged efficiently by automatic processing equipment.

A further object of the present invention is to provide a latching system that includes a means for indicating to the processing equipment that the latch is in an open position.

Still a further object of the present invention is to provide a latching system that seals from the external environment a major portion of the moving mechanisms contained within the latch.

Yet a further object of the present invention is to provide a latching system that reduces the amount of external vacuum required to actuate the latch.

These and other objects, as well as these and other features and advantages of the present invention will become readily apparent to those skilled in the art from a review of the following detailed description of the preferred embodiment in conjunction with the accompanying drawings and claims.

DESCRIPTION OF THE DRAWINGS

FIG. 1 is an exploded perspective view of the container and door which are elevated above a portion of the processing equipment.

FIG. 2 is a perspective view of the latch removed from the door.

FIG. 3 is a top planar view of the bottom half of the latch housing of the type shown in FIG. 2 with the plunger in the first locking position.

FIG. 4 is a bottom planar view of the top half of the latch housing of the type shown in FIG. 2.

DETAILED DESCRIPTION OF THE PREFERRED EMBODIMENT

Figure 5:
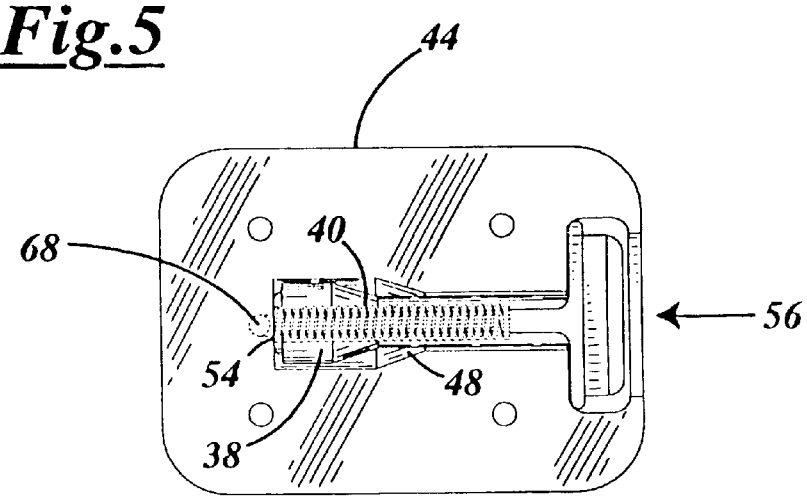
FIG. 5 is a top planar view of the bottom half of the latch housing of the type shown in FIG. 2 with the plunger in the second retracted position.

Referring first to FIG. 1, there is shown generally a container 10 and door 12 elevated above a port door of the semiconductor wafer processing tool 14. The container 10 has an enclosed top 16 and sidewalls 18. A lip 20 extends around the perimeter of the container 10, defining the open end 22 of the container 10. A sealing surface 24 is formed on an interior portion 26 of the lip 20. In the preferred embodiment, a latching recess 28 is formed within the interior portion 26 of the lip 20 below the sealing surface 24, on each interior side of the container 10.

The door 12 is planar in shape and dimensioned to seal against sealing surface 24 of the container 10. A compressible seal 30 (not visible) is aligned on the upper surface perimeter 32 of the door 12 which engages with the sealing surface 24 of the lip 20. Approximately five pounds of compressive force is necessary to hermetically seal the door 12 to the container 10.

Latches 34 are attached by known means to the door 12 and aligned to correspond with the latch recesses 28. When the door 12 is sealably engaged to the container 10, under approximately five pounds of compressive force, each latch 34 engages the corresponding recess 28 of the container 10, thereby preventing removal of the door 12. The engaged latch 34 also inhibits the door 12 from moving or jarring out of sealable engagement with the container 10. The latch inhibits removal of the door 12 from the container 10, even in situations where the container is mishandled or inverted.

The various devices used during the semiconductor manufacturing process should have characteristics that reduce the amount of small particles, vapors or static discharge in the environment. Without limitation, the container 10 is preferably molded of a combination of polycarbonate and approximately 10–30% by volume polytetrafluoroethylene (PTFE), the door 12 is preferably molded of polycarbonate, and latch 34 is preferably manufactured from a low outgassing, low coefficient of friction, and high dielectric constant material. One such material is DELRIN®, available from E.I. duPont de Nemours & Co. (Inc.).

Referring next to FIG. 2, the latch 34 is generally shown. The latch 34 comprises a housing 36, plunger 38 and a compression spring 40. As shown in FIGS. 3–7, the shape of the plunger 38 dictates that the housing 36 consist of a top and bottom member 42 and 44. Those skilled in the art will recognize that the shape of the plunger may vary such that the housing may be constructed of one singular member. The top and bottom members 42 and 44 may be fastened together through bores 46 with self tapping screws or may be bonded together by other known means. The specific components of the latch 34 will now be discussed in greater detail.

Referring next to FIGS. 3 and 4, the top and bottom housing members 42 and 44 are shown in greater detail. The top housing 42 has an upper mortise 50 formed therein, and the bottom housing 44 has a lower mortise 52 formed therein. When the top and bottom housings 42 and 44 are aligned and engaged, the upper and lower mortise 50 and 52 align and form generally the mortise 48 of the housing 36. The upper and lower mortise 50 and 52 are identical.

Generally, the mortise 48 extends partially into the housing 36 to a closed end 54 of the mortise. An open end 56 of the mortise is formed on an outer end surface 58 of the housing 36. In the preferred embodiment shown in FIGS. 3–7, the mortise 48 has the overall shape of the plunger 38. The mortise 48 includes a first cylindrical section 60, a tapered section 62 tapering from the first cylindrical section 60 to a second smaller cylindrical section 64. The second cylindrical section 64 extends to a cavity 66 which opens to the outer end surface 58 of the housing 36 (see FIG. 4). A vacuum duct 68 extends from a bottom surface 70 of the bottom housing 44 into the closed end 54 of the mortise 48.

Figure 6:
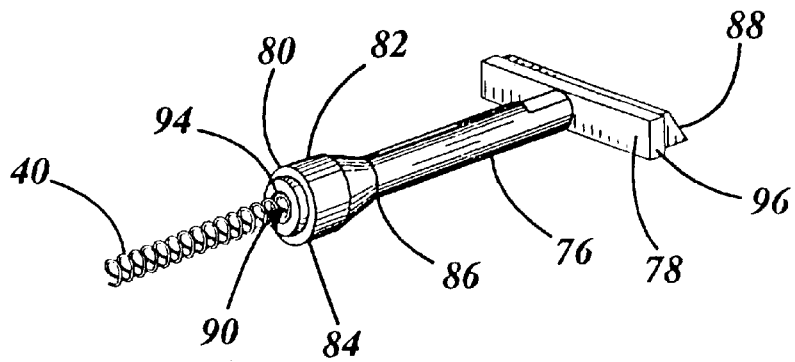
FIG. 6 is a perspective end view of the plunger of the type shown in FIG. 3.
Figure 7:
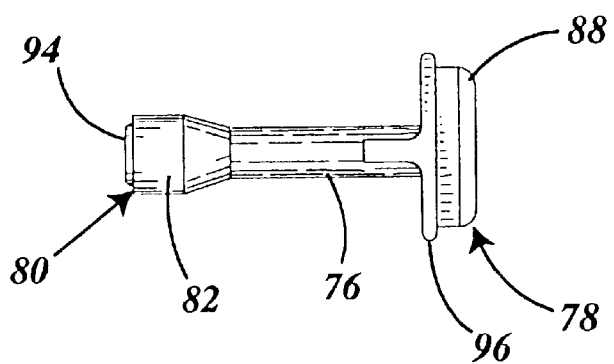
FIG. 7 is a top planar view of the plunger of the type shown in FIG. 3 with the compression spring removed.

Referring now to FIGS. 6 and 7, the plunger 38 is generally shown. In use the plunger 38 is mounted within the mortise 48 for slidable movement between a first closed locking position 72 (shown in FIG. 3) and a second open position 74 (shown in FIG. 5). The plunger 38 comprises a barrel or body 76 having a head 78 formed on one end and a seat 80 formed on the other. A tapered shoulder 82 tapers from a larger diameter 84 starting proximate the seat 80 of the plunger 38 to a second smaller diameter 86 along the longitudinal axis of the barrel 76. The head 78 of the plunger 38 has an angled lead-in surface 88, which minimizes friction when the plunger is forced into the recess 28 of the container 10.

The seat 80 of the plunger 38 has a recess 90 that extends into the barrel 76 along the longitudinal axis of the barrel 76. The compression spring 40 is inserted into this recess 90, thereby allowing the use of a longer compression spring. As shown in FIGS. 3 and 5, the compression spring 40 is positioned between the closed end 54 of the mortise 48 and the plunger 38. The compression spring 40 is dimensioned to bias the plunger 38 toward the first locking position 72.

In the preferred embodiment, an annular channel 72 is formed along the perimeter of the seat's 80 planar surface. A replaceable gasket or o-ring 94 may be engaged within the channel 92 of the seat 80. The diameter of vacuum duct 68 is smaller than the outer diameter of the seat 80 and inner diameter of the o-ring 94. When the plunger 38 is retracted to the second open position 74, the o-ring 94 seals against the closed end 54 of the mortise 48. Those skilled in the art will recognize that the vacuum duct 68 may extend from an outer surface of the housing 36 into other portions of the mortise 48. However, extending the duct 68 into the closed end 54 of the mortise 48, minimizes the amount of vacuum necessary to retract the plunger 38 to the second open position 74.

The shoulder 82 of the plunger 38 and the tapered section 62 of the mortise 48 are dimensioned so that, when the compression spring 40 forces the plunger 38 to the locking position 72, the shoulder 82 acts as a stop against the tapered section 62 of the mortise 48, thereby restricting the travel distance of the plunger 38 (see FIGS. 3 and 5).

The head 78 of the plunger 38 is dimensioned slightly smaller than the open end 56 of the mortise 48. A lip 96 is formed on the plunger's head 78. When the plunger's head 78 is forced through the opening 56 of the housing 36, the lip 96 contacts an inner perimeter surface 98 (see FIG. 4) of the open end 56 of the mortise 48, blocking the open end 56. When the lip 96 of the head 78 is in a blocking position, any particulate generated from the sliding movement of the plunger 38 is trapped within the mortise 48. When the vacuum is applied to disengage the latch 34 from the container 10, the vacuum suctions away any particulate contained within the mortise 48.

Those skilled in the art will immediately recognize that the plunger 38 will only move to the retracted position 74 if the spring's 40 biasing force is overcome. In the present invention, a vacuum is applied through vacuum duct 68 to overcome the spring 40. Using a vacuum to move the plunger 38 also offers the advantage of creating a cushion of air between the plunger 38 and mortise 48 to reduce scrapping. Applying such a vacuum also serves to draw through the vacuum any particulate which may be formed within the latch 34. When the plunger 38 is biased from a retracted position 74 to a locking position 72, a slight vacuum may be applied sufficient to create the air cushion and draw particle through the latch 34 and out the duct 68, but not sufficient to overcome the biasing force of the spring 40.

Figure 8:
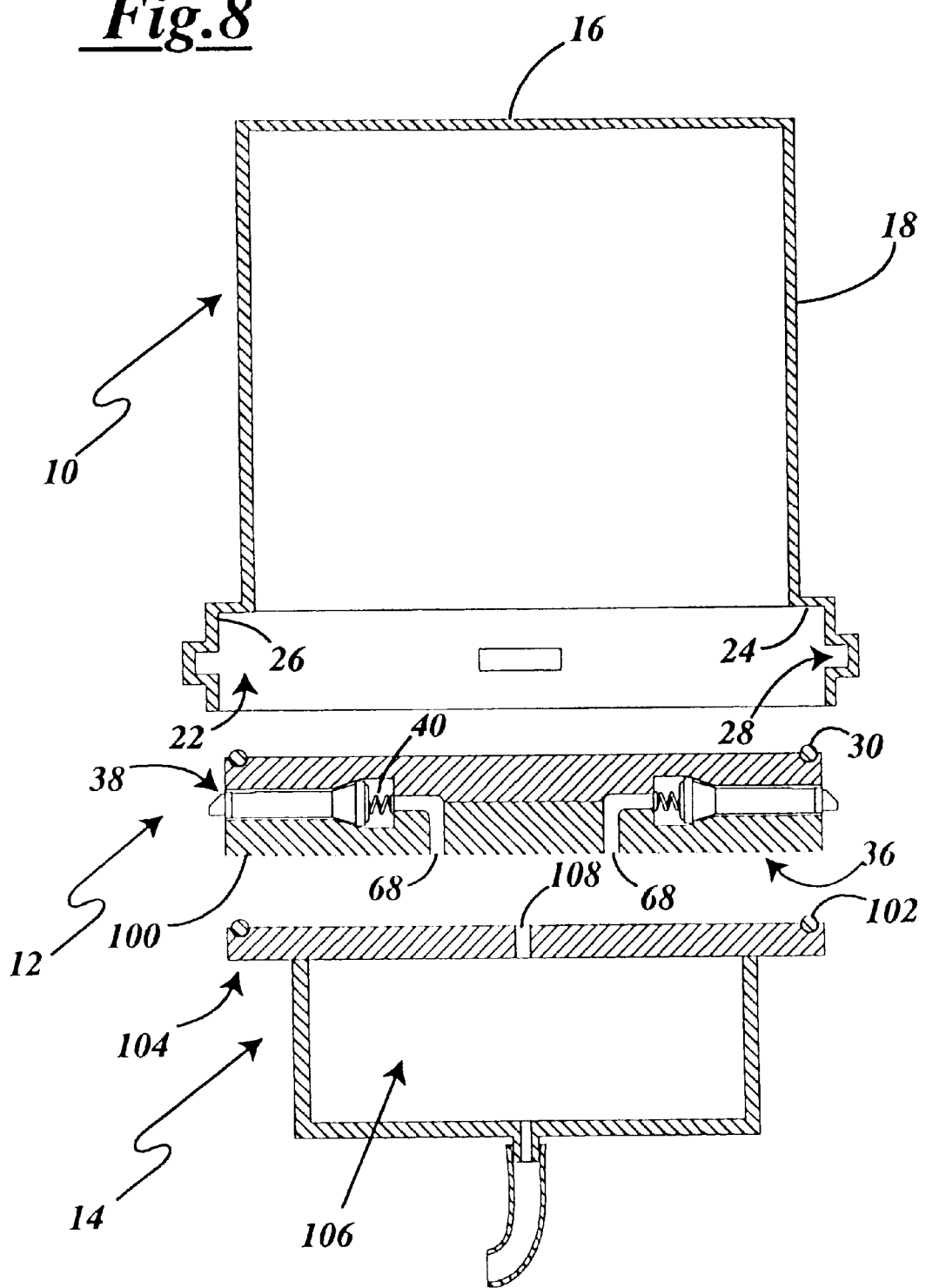
FIG. 8 is an exploded partial sectional side elevational view of an alternate preferred container and door elevated above an alternate preferred embodiment of the processing equipment.

Referring next to FIG. 8, an alternate preferred embodiment is shown, wherein the door 12 has latches 34 formed within the door 12 itself. The door 12 serves as the housing 36 for all four latches 34. A mortise 48 is provided on each end of the door 12, whereby the plunger 38 is slidable within the mortise 48 between the first locking position 72 and a second retracted position 74. Each vacuum duct 68 extends from the bottom surface 100 of the door 12 into the closed end 54 of each mortise 48. A replaceable seal 102 of known construction is positioned around the perimeter of the port door 104 of the processing equipment 14. In this manner, the port door 104 of the processing 14 seals the outer bottom surface 100 of the door 12, creating a manifold which links all the vacuum ducts 68 of the several latches 34 to a central vacuum reservoir 106 through central line 108.

Figure 9:
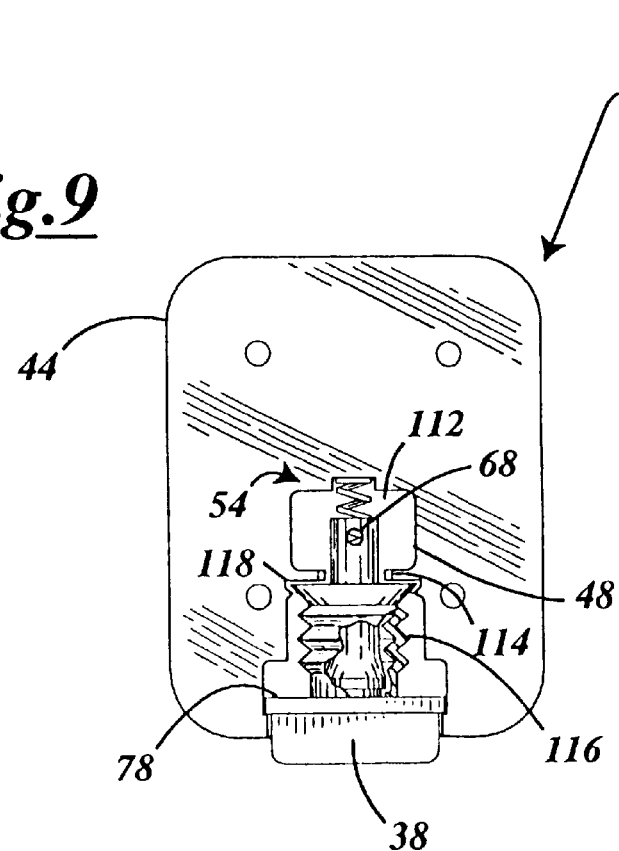
FIG. 9 is a top planar view of an alternate preferred embodiment of the bottom half of the latch housing with the plunger in the first locking position.

Referring now to FIG. 9, the bottom half of an alternate preferred latch is shown. Proximate the closed end 54 of the mortise 48, a vacuum cavity 112 is formed within the mortise. The cavity has an opening 114 through which the plunger barrel 76 slides. One end of a replaceable bellow 116 is attached in a groove 118 within the mortise 48 on an external side of the vacuum cavity 112. The other end of the bellow 116 is attached to the head 78 of the plunger 38, thereby sealing a major portion of plunger 38 from the external environment. The atmospheric pressure will keep the bellow 116 pushed inward as long as the vacuum is being applied. The bellow 116 is preferably made from a flexible elastomeric polymer, such that as the plunger 38 moves between the first locking position 72 and the second retracted position 74, the bellow simply folds back onto itself. The bellow also enhances the suctioning ability of the processing equipment vacuum.

Figure 10:
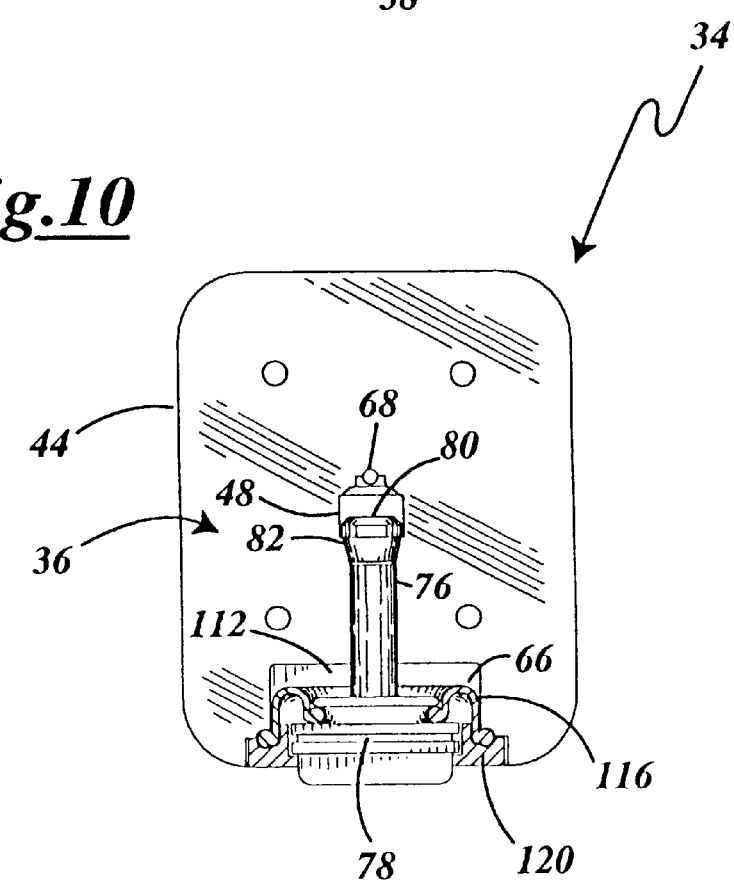
FIG. 10 is a top planar view of still another alternate preferred embodiment of the bottom half of the latch housing with the plunger in the first locking position.

FIG. 10 illustrates yet another alternate preferred embodiment of the latch 34. In this embodiment, a single fold bellow has one end attached by known means to the housing 36 and the other end is attached to the head 78 of the plunger 38, thereby sealing a major portion of plunger 38 from the external environment. The cavity 66 of the mortise 48 serves as the vacuum cavity 112. Those skilled in the art will recognize that the flexible elastomeric properties of the bellow may eliminate the need for the compression spring 40, thereby forcing the plunger to the first locking position when the amount of applied vacuum is decreased. Thus, without any limitation intended, those skilled in the art will recognize that either the bellow 116 or spring 40 may act as a means for forcing the plunger into the first locking position, wherein both the spring and bellow are retractable to the second open position. Also, the o-ring 94 may not be necessary since the plunger 38 is sealed within the housing 36 by the bellow 116. A retainer ring 120 of known construction may be used to retain the bellow 116 against the outer end surface 58 of the housing 36.

Having described the constructional features of the present invention, the mode of use will now be discussed. In the preferred embodiment shown in FIG. 1, the user centers the door 12 over the port door 104 of the processing equipment 14 such that each latch 34 is aligned with a suction 110 of the processing equipment 14. In the preferred embodiment, a negative vacuum is applied through each suction 110, thereby drawing the plunger 38 from the first locking position 72 to a second open position 74. Those skilled in the art will recognize that a vacuum reservoir 106 may be necessary to minimize the amount of time necessary to create a suction sufficient to draw the plunger 38 to the second open position 74. Also, the reservoir may be used as an indication of when the latches 34 are in the open position 74. When a vacuum is applied to the latches 34, the plunger 38 is suctioned toward the second open position 74. Once the o-ring 94 seals against the closed end 54 of the mortise, the pressure in the reservoir 106 will change, indicating that the latch 34 has been completely retracted. A pressure gauge may be linked in communication with the processing equipment 14, wherein, once the change in pressure reaches a predetermined threshold the processor or user may deduce that the latch 34 is in the second open position 74.

Once the processing equipment or user determines that the latches 34 are in the open position (by monitoring the pressure in the vacuum reservoir), a cassette containing semiconductor wafers is placed on top of the door 12 and the container 10 is then lowered onto the door 12. A force is applied to the door 12 in order to compress the seal 30 and hermetically seal the container and door. The vacuum is released enough to allow the spring 40 to bias the plunger 38. The compression spring 40 forces the plunger 38 through the mortise 48 open end 56 to the first locking position 72. The compressive force against the container 10 may then be released. The container remains latched and hermetically sealed to the door.

To remove the door 12 from the container 10, the user aligns the suctions 110 to each latch 34, applying a negative vacuum to the latch 34. The vacuum draws the plunger 38 into the retracted second open position 74. The door 12 may then be removed from the container 10.

This invention has been described herein in considerable detail in order to comply with the patent statutes and to provide those skilled in the art with the information needed to apply the novel principles and to construct and use such specialized components as are required. However, it is to be understood that the invention can be carried out by specifically different devices, and that various modifications, both as to the equipment details and operating procedures, can be accomplished without departing from the scope of the invention itself.

What is claimed is:

1. A vacuum actuated mechanical latch used to secure a door in sealable engagement to a semiconductor wafer container, comprising:

a. a housing for attachment to said semiconductor wafer container having a mortise extending through a portion of said housing terminating in a closed end and further having a bore extending from an outer surface of said housing into the mortise;

b. a plunger slidingly engaged with the mortise of said housing between a first locking position and a second open position; and c. a bellow for forcing the plunger into the first locking position, wherein said bellow is retractable to the second open position, wherein a first end of the bellow is attached to the housing, and a second end of the bellow is attached to the plunger.

2. The latch as recited in claim 1, further including a means for actuating said plunger from the first locking position to the second open position.

3. The latch as recited in claim 1, wherein said plunger further comprises a barrel having a head formed on one end of the barrel and a seat formed on another end of the barrel distal to the head.

4. The latch as recited in claim 3, wherein the barrel further includes a longitudinal tapered shoulder extending from the seat toward said head.

5. The latch as recited in claim 4, further including a gasket engaged to said seat, wherein the gasket sealably engages the plunger to the closed end of the mortise.

6. The latch as recited in claim 3, further including a gasket engaged to said seat, wherein the gasket sealably engages the plunger to the closed end of the mortise.

7. The latch as recited in claim 3 wherein the head of said plunger has an angled lead-in surface which minimizes friction when the plunger is forced in the first locking position.

8. The latch as recited in claim 1, wherein the means for forcing includes a compression spring.

9. A sealable semiconductor wafer container having a vacuum actuated mechanical latch, comprising:

a. a container having a closed top, sidewalls, an open bottom end, and a hermetically sealable door for closing the open bottom end;

b. a plurality of latches for mechanically latching said door to said container between a first locking position, wherein the door is latched to the container, and a second retracted position, wherein the door is removable from said container; and c. vacuum actuated means for drawing said plurality of latches from the first locking position to the second retracted position wherein each said latch further comprises: a housing, a plunger, and a bellow, said housing having a mortise extending from an outer surface of said housing to a closed end and further having a bore extending from an outer surface of said bore into the mortise; said plunger slidingly engages with the mortise of said housing, said plunger comprises a barrel having a head formed on one end of the barrel and a seat formed on another end of the barrel distal to the head; a first end of said bellow being attached to the housing and a second end of said bellow being attached to said plunger.

10. The container as recited in claim 9, wherein said latch further comprises: a housing, a plunger, and a compression spring, said housing having a mortise extending from an outer surface of said housing to a closed end and further having a bore extending from an outer surface of said bore into the mortise; said plunger slidingly engages with the mortise of said housing, said plunger comprises a barrel having a head formed on one end of the barrel and a seat formed on another end of the barrel distal to the head.

11. The latch as recited in claim 10, wherein the barrel further includes a longitudinal tapered shoulder extending from the seat toward said head.

12. The latch as recited in claim 10, further including a gasket engaged to said seat, wherein the gasket sealably engages the plunger to the closed end of the mortise.

13. The latch as recited in claim 10 wherein the head of said plunger has an angled lead-in surface which minimizes friction when the plunger is forced in the first locking position thereby engaging an inner recess of said container.

* * * * *